US010614861B2

(12) United States Patent
Tanaka et al.

(10) Patent No.: US 10,614,861 B2
(45) Date of Patent: Apr. 7, 2020

(54) APPARATUSES AND METHODS FOR GENERATING A VOLTAGE IN A MEMORY

(71) Applicant: MICRON TECHNOLOGY, INC., Boise, ID (US)

(72) Inventors: Hitoshi Tanaka, Tokyo (JP); Yasunori Orito, Tsukuba (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/273,913

(22) Filed: Feb. 12, 2019

(65) Prior Publication Data
US 2019/0180794 A1   Jun. 13, 2019

Related U.S. Application Data

(62) Division of application No. 15/663,545, filed on Jul. 28, 2017, now Pat. No. 10,249,348.

(51) Int. Cl.
*G11C 5/14* (2006.01)
*G05F 3/26* (2006.01)
(Continued)

(52) U.S. Cl.
CPC ............ *G11C 5/147* (2013.01); *G05F 1/10* (2013.01); *G05F 1/46* (2013.01); *G05F 3/16* (2013.01);
(Continued)

(58) Field of Classification Search
CPC . G11C 5/147; G05F 3/262; G05F 3/16; G05F 1/10; G05F 1/46; G05F 1/595; G05F 1/613; G05F 1/618
See application file for complete search history.

(56) References Cited

U.S. PATENT DOCUMENTS

| 5,187,395 A | 2/1993 | Pirez |
| 5,604,453 A | 2/1997 | Pedersen |

(Continued)

FOREIGN PATENT DOCUMENTS

| CN | 86108332 A | 11/1988 |
| CN | 101394152 A | 3/2009 |
| WO | 20180000237 A1 | 1/2018 |

OTHER PUBLICATIONS

U.S. Appl. No. 15/312,010, entitled "Voltage Generation Circuit", filed Nov. 17, 2016, pp. all.

(Continued)

*Primary Examiner* — Jung Kim
(74) *Attorney, Agent, or Firm* — Dorsey & Whitney LLP

(57) ABSTRACT

Apparatuses and methods for generating a voltage are described. An example apparatus includes first, second, and third bias circuits configured to provide first, second, and third bias signals, respectively. The example apparatus further includes a voltage output circuit configured to receive the first, second, and third bias signals. The voltage output circuit includes an output circuit and a current circuit. The output circuit includes an output node, a first node, and an input circuit configured to receive the first bias signal. The output circuit is configured to provide an output voltage at the output node having a magnitude based on the magnitude of the first bias signal. The current circuit includes a first transistor configured to receive the second bias signal and further includes a second transistor configured to receive the third bias signal. The first transistor and second transistor are coupled in parallel and to the first node.

16 Claims, 8 Drawing Sheets

(51) Int. Cl.
  *G05F 3/16* (2006.01)
  *G05F 1/46* (2006.01)
  *G05F 1/10* (2006.01)
  *G11C 11/4074* (2006.01)
  *G11C 11/408* (2006.01)
  *G11C 7/04* (2006.01)

(52) U.S. Cl.
  CPC .......... *G05F 3/262* (2013.01); *G11C 11/4074* (2013.01); *G11C 11/4085* (2013.01); *G11C 7/04* (2013.01)

(56) References Cited

U.S. PATENT DOCUMENTS

| | | | |
|---|---|---|---|
| 5,889,431 A * | 3/1999 | Csanky | G05F 3/262 323/315 |
| 6,054,893 A | 4/2000 | Singh | |
| 6,567,441 B2 | 5/2003 | Furudate et al. | |
| 6,750,720 B1 | 6/2004 | Mori et al. | |
| 7,034,514 B2 | 4/2006 | Tachibana et al. | |
| 7,579,821 B2 | 8/2009 | Lee et al. | |
| 7,639,066 B2 | 12/2009 | Harald | |
| 9,250,696 B2 * | 2/2016 | Kumar | H03K 19/0008 |
| 9,473,127 B1 | 10/2016 | Azin | |
| 10,249,348 B2 | 4/2019 | Tanaka et al. | |
| 2004/0042317 A1 | 3/2004 | Marr et al. | |
| 2007/0069710 A1 | 3/2007 | Lee et al. | |
| 2007/0247931 A1 * | 10/2007 | Kim | G11C 5/147 365/189.09 |
| 2008/0239834 A1 | 10/2008 | Tran et al. | |
| 2009/0140793 A1 | 6/2009 | Byeon | |
| 2010/0253419 A1 | 10/2010 | Ogai et al. | |
| 2014/0247087 A1 | 9/2014 | Bhattad et al. | |
| 2015/0229296 A1 | 8/2015 | Kim | |
| 2018/0226107 A1 | 8/2018 | Pan et al. | |
| 2019/0035434 A1 | 1/2019 | Tanaka et al. | |
| 2019/0287576 A1 | 9/2019 | Tanaka et al. | |

OTHER PUBLICATIONS

U.S. Appl. No. 15/663,545, entitled "Apparatuses and Methods for Generating a Voltage in a Memory", filed Jul. 28, 2017, pp. all.
U.S. Appl. No. 16/435,197 entitled "Apparatuses and Methods for Generating a Voltage in a Memory"; filed Jun. 7, 2019; pp. all.
U.S. Appl. No. 16/548,729 titled "Voltage Generation Circuit" filed Aug. 22, 2019, pp. all.

* cited by examiner

APPARATUSES AND METHODS FOR GENERATING A VOLTAGE IN A MEMORY

CROSS REFERENCE TO RELATED APPLICATIONS

This application is a divisional of U.S. patent application Ser. No. 15/663,545 filed Jul. 28, 2017 and issued as U.S. Pat. No. 10,249,348 on Apr. 2, 2019. The aforementioned application, and issued patent, is incorporated herein by reference, in its entirety, for any purpose.

BACKGROUND

Semiconductor memories, such as dynamic random access memory (DRAM), are used in a multitude of electronics systems (e.g., portable computers, desktop computers, server systems, mobile devices, etc.) and have gone through several advancements over the years. For example, memories have become smaller, have higher memory density, have faster access speeds, and use less power than previous memories.

However, further advancement in memory design may require additional improvements. For example, to further reduce power consumption by memories, improvements may include reducing leakage currents. Gate-induced drain leakage (GIDL) currents may occur in certain semiconductor devices, such as field-effect transistors, which are components of semiconductor memories. GIDL currents occur when a voltage of a certain magnitude is present on the gate of the transistor that causes current to leak from the drain of the transistor through the substrate. Reducing GIDL currents may reduce power consumption by memories.

DETAILED DESCRIPTION

Certain details are set forth below to provide a sufficient understanding of examples of the disclosure. However, it will be clear to one having skill in the art that examples of the disclosure may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring the disclosure. Additionally, terms such as "couples" and "coupled" mean that two components may be directly or indirectly electrically coupled. Indirectly coupled may imply that two components are coupled through one or more intermediate components.

Figure 1:
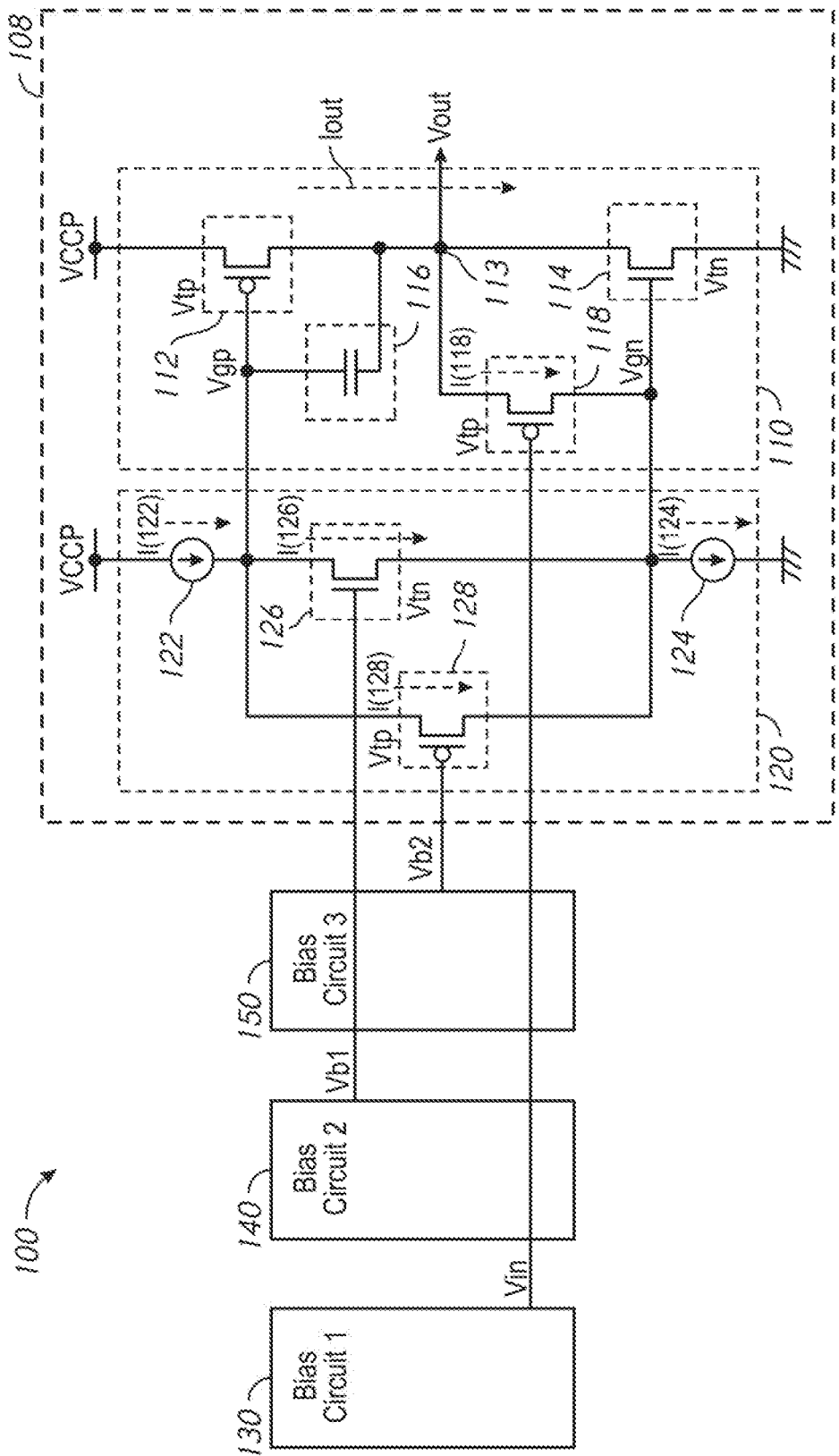
FIG. 1 is a schematic diagram of a voltage circuit according to an embodiment of the disclosure.

FIG. 1 is a schematic diagram of a voltage circuit 100 according to an embodiment of the disclosure. The voltage circuit 100 provides a stable voltage Vout and current Iout. The stable Vout voltage and Iout current may reduce fluctuation in bias current and current consumption compared to conventional designs for voltage circuits. The Vout voltage and current Iout may be used for various purposes. For example, in some embodiments of the disclosure, the Vout voltage may be provided to one or more word line drivers of a row decoder. The voltage may be provided to reduce leakage currents, for example, gate induced drain leakage (GIDL) current for transistors of the word line drivers. However, voltage circuits according to embodiments of the disclosure, such as the voltage circuit 100, are not limited to the specific use previously described for reducing GIDL current.

The voltage circuit 100 includes a voltage output circuit 108 and bias circuits 130, 140, and 150. The bias circuit 130 provides an input voltage Vin to the voltage output circuit 108. The bias circuit 140 provides a bias voltage Vb1 and the bias circuit 150 provides a bias voltage Vb2.

The bias circuit 130 may provide a temperature and voltage independent Vin voltage that does not vary due to variations in temperature and voltage. As will be described below, the voltage output circuit 108 provides a voltage Vout that has a magnitude based on the Vin voltage provided by the bias circuit 130. The Vout voltage provided by the voltage output circuit 108 may be stable and independent of variations in temperature and voltage. The voltage output circuit 108 may also provide a stable output bias current.

The voltage output circuit 108 includes an output circuit 110 and a current circuit 120. The output circuit 110 includes a pull-up circuit 112 and a pull-down circuit 114 coupled in series between a power supply (e.g., power supply providing VCCP supply voltage) and a reference voltage (e.g., ground). The Vout voltage is provided from a node 113 to which the pull-up circuit 112 and the pull-down circuit 114 are coupled. The output circuit 110 further includes a capacitance 116 and an input circuit 118. The capacitance 116 is coupled between a gate of the pull-up circuit 112 and the node 113. The capacitance 116 may be a capacitor that provides phase compensation (e.g., mirror compensation capacitor). The input circuit 118 is coupled between a gate of the pull-down circuit 114 and the node 113. The input circuit 118 receives the Vin voltage from the bias circuit 130. The pull-up circuit 112 and the input circuit 118 are shown as including p-channel transistors, and the pull-down circuit 114 is shown as including an n-channel transistor in FIG. 1. In other embodiments of the disclosure, the pull-up circuit 112, pull-down circuit 114, and input circuit 118 may include additional/alternative circuits (e.g., different transistor types, conductivities, etc.).

The current circuit 120 includes a current source circuit 122 and a current source circuit 124. The current source circuit 122 is configured to be coupled to a power supply and provide a current I (122) and the current sink circuit 124 is configured to be coupled to a reference voltage and drain a current I (124). The current circuit 120 further includes transistors 126 and 128 that are coupled in parallel between the current source circuits 122 and 124. The transistor 126 receives the Vb1 voltage from the bias circuit 140 at a gate and the transistor 128 receives the Vb2 voltage from the bias circuit 150 at a gate. The current circuit 120 may help stabilize the Iout current through the pull-up and pull-down circuits 112 and 114, thus reducing bias current fluctuation of the voltage output circuit 108. The Vb1 and Vb2 bias voltages provided by the bias circuits 140 and 150 to the transistors 126 and 128 of the current circuit 120, respectively, may be used to set a bias current of the output circuit 110. While the current circuit 120 is shown in FIG. 1 as including transistors 126 and 128, in some embodiments of the disclosure, the current circuit 120 includes one of the transistors 126 or 128. In other embodiments of the disclosure, the current circuit 120 includes circuits in addition to the transistors 126 and 128, for example, additional transistors.

The bias circuit 140 provides the Vb1 voltage sufficient to cause the transistor 126 to be conductive relative to a gate voltage Vgn of the pull-down circuit 114 being at a threshold voltage Vtn (e.g., the voltage between a gate and source) of the pull-down circuit 114. For example, in some embodiments of the disclosure, the bias circuit 140 provides the Vb1 voltage that is the sum of the threshold voltages of the pull-down circuit 114 and of the transistor 126, that is, Vb1=Vtn(114)+Vtn(126). The bias circuit 150 provides a Vb2 voltage sufficient to cause the transistor 12.8 to be conductive relative to a gate voltage Vgp of the pull-up circuit 112 being at a threshold voltage Vtp (e.g., the voltage between a gate and source) of the pull-up circuit 112. For example, in some embodiments of the disclosure, the bias circuit 150 provides a Vb2 voltage that is the power supply voltage reduced by the sum of the threshold voltages of the pull-up circuit 112 and of the transistor 128, that is, Vb2=VCCP−(Vtp(112)+Vtp(126)). As will be described in more detail below, the conductivity of the transistors 126 and 128 may change based on changes to the Vgn and Vgp voltages during operation.

The bias circuits 140 and 150 may provide stable, temperature and voltage independent Vb1 and Vb2 voltages and respective bias currents that do not vary due to variations in temperature and voltage. Using bias circuits 140 and 150 to provide the bias voltages Vb1 and Vb2 separately from the Vin voltage provided by the bias circuit 130 may reduce bias current fluctuations of the current circuit 120, which as previously described, may help stabilize the Iout current through the pull-up and pull-down circuits 112 and 114, and reduce bias current fluctuation of the voltage output circuit 108.

Figure 2:
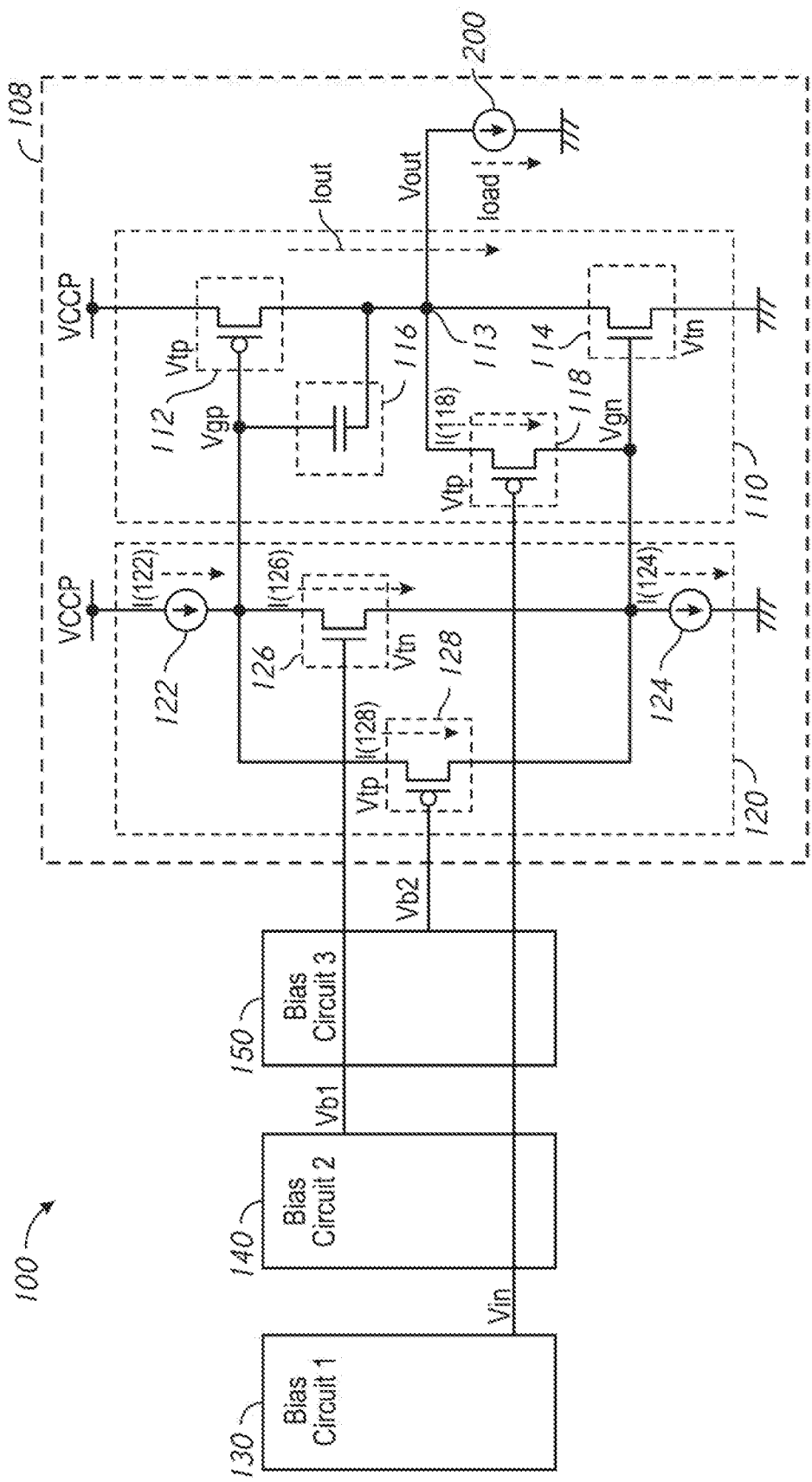
FIG. 2 is a block diagram of the voltage circuit of FIG. 1 coupled to a circuit load that causes a voltage decrease.
Figure 3:
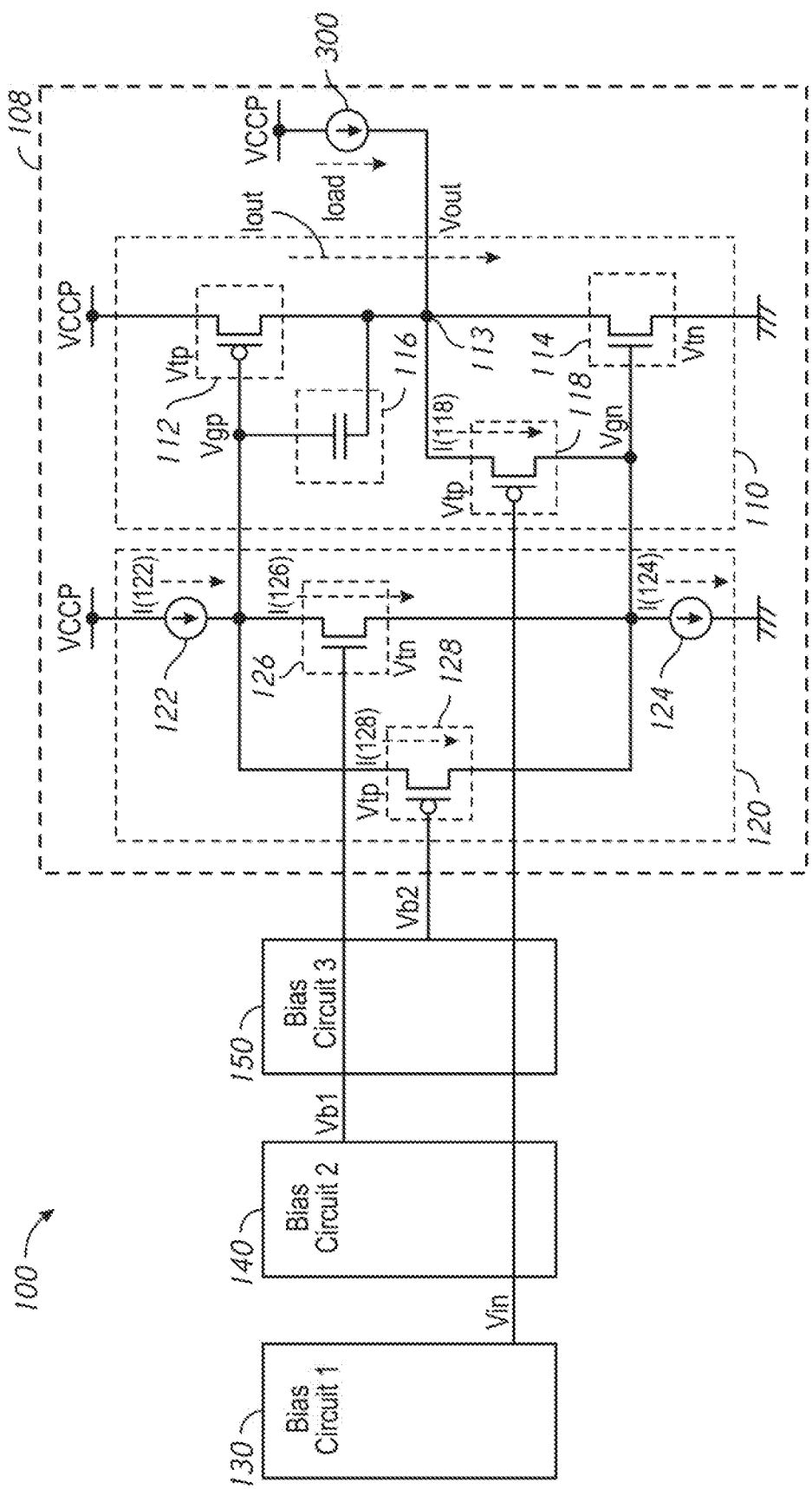
FIG. 3 is a block diagram of the voltage circuit of FIG. 1 coupled to a circuit load that causes a voltage increase.

Operation of the voltage circuit 100 will be described with reference to FIGS. 1, and 3. FIG. 2 is a block diagram of the voltage circuit 100 according to an embodiment of the disclosure having a circuit load 200 coupled to the node 113 that causes the Vent voltage to decrease. FIG. 3 is a block diagram of the voltage circuit 100 according to an embodiment of the disclosure having a circuit load 300 coupled to the node 113 that causes the Tout voltage to increase.

With reference to FIG. 1, the bias circuit 130 provides the Vin voltage to the input circuit 118 of the output circuit 110. Additionally, in the present example, the bias circuit 140 provides the Vb1 voltage of Vtn (114)+Vtn (126) and the bias circuit 150 provides the Vb2 voltage of VCCP−(Vtp (112)+Vtp (128)). In this bias condition, the Vgp voltage at the gate of the pull-up circuit 112 is Vtp (112) and the Vgn voltage at the gate of the pull-down circuit 114 is Vtn (114). As a result, both the pull-up circuit 112 and the pull-down circuit 114 are conductive. Moreover, the Vout voltage is Vin+Vtp (118), where Vtp (118) is the threshold voltage of the input circuit 118.

Assuming that the current of each of the bias circuits 130, 140, and 150 are i, the current I(122) of the current source circuit 122 is 2i, and the current I(124) of the current sink circuit 124 is 3i, the current through the transistor 128 is i, the current through the transistor 126 is i, and the current through the input circuit 118 is also i. The Iout current through the pull-up and pull-down circuits 112 and 114 is a factor of i. For example, the Iout current may be scaled based on the size of transistors of the pull-up and pull-down circuits 112 and 114 relative to the size of transistors included in the bias circuits 140 and 150. For example, where the transistors included in the pull-up and pull-down circuits 112 and 114 are four-times the size of the transistors of the bias circuits 140 and 150, the Iout current is 4i.

With reference to FIG. 2, as previously described, the load 200 causes the Vout voltage to decrease from an initial voltage (e.g., Vin+Vtp(118)). The decrease in the Vout voltage reduces the gate-source voltage across the input circuit 118, which in turn causes the voltage Vgn at the gate of the pull-down circuit 114 to decrease. As a result of the decreased. Vgn voltage, the pull-down circuit 114 becomes less conductive. The decrease in the Vout voltage is also coupled through the capacitance 116 to reduce the voltage Vgp at the gate of the pull-up circuit 112, As a result of the decreased Vgp voltage, the pull-up circuit 112 becomes more conductive. The more conductive pull-up circuit 112 and the less conductive pull-down circuit 114 causes the Vout voltage to increase toward the initial voltage. With regards to the current circuit 120, the decreasing Vgp voltage reduces the gate-source voltage of the transistor 128, but the decreasing Vgn voltage increases the gate-source voltage of the transistor 126. The transistor 128 becomes less conductive to conduct less current while the transistor 126 becomes more conductive to conduct more current, As a result, the total current through the current circuit 120 remains relatively stable, which may help stabilize the current through the input circuit 118.

In summary, the voltage circuit 100 reacts to the load 200 at the node 113 that causes the Vout voltage to decrease by increasing the voltage at the node 113 toward the initial voltage. Additionally, the current Iout of the voltage circuit 100 remains stable as the voltage circuit 100 increases the voltage at the node 113 to compensate for the load 200.

With reference to FIG. 3, as previously described, the load 300 causes the Vout voltage to increase from an initial voltage (e.g., Vin+Vtp (118)). The increase in the Vout voltage increases the gate-source voltage across the input circuit 118, which in turn causes the Vgn voltage at the gate of the pull-down circuit 114 to increase. As a result of the increased Vgn voltage, the pull-down circuit 114 to become more conductive. The increase in the Vout voltage is also coupled through the capacitance 116 to increase the Vgp voltage at the gate of the pull-up circuit 112. As a result of the increased Vgp voltage, the pull-up circuit 112 becomes less conductive. The less conductive pull-up circuit 112 and the more conductive pull-down circuit 114 causes the Vout voltage to decrease toward the initial voltage. With regards to the current circuit 120, the increasing Vgp voltage increases the gate-source voltage of the transistor 128 but the increasing Vgn voltage decreases the gate-source voltage of the transistor 126. The transistor 128 becomes more conductive to conduct more current while the transistor 126 becomes less conductive to conduct less current. As a result, the total current through the current circuit 120 remains relatively stable, which may help stabilize the current through the input circuit 118.

In summary, the voltage circuit 100 reacts to the load 300 at the node 113 that causes the Vout voltage to increase by decreasing the voltage at the node 113 toward the initial voltage. Additionally, the current Iout of the voltage circuit 100 remains stable as the voltage circuit 100 decreases the voltage at the node 113 to compensate for the load 300.

Figures 4, 5:
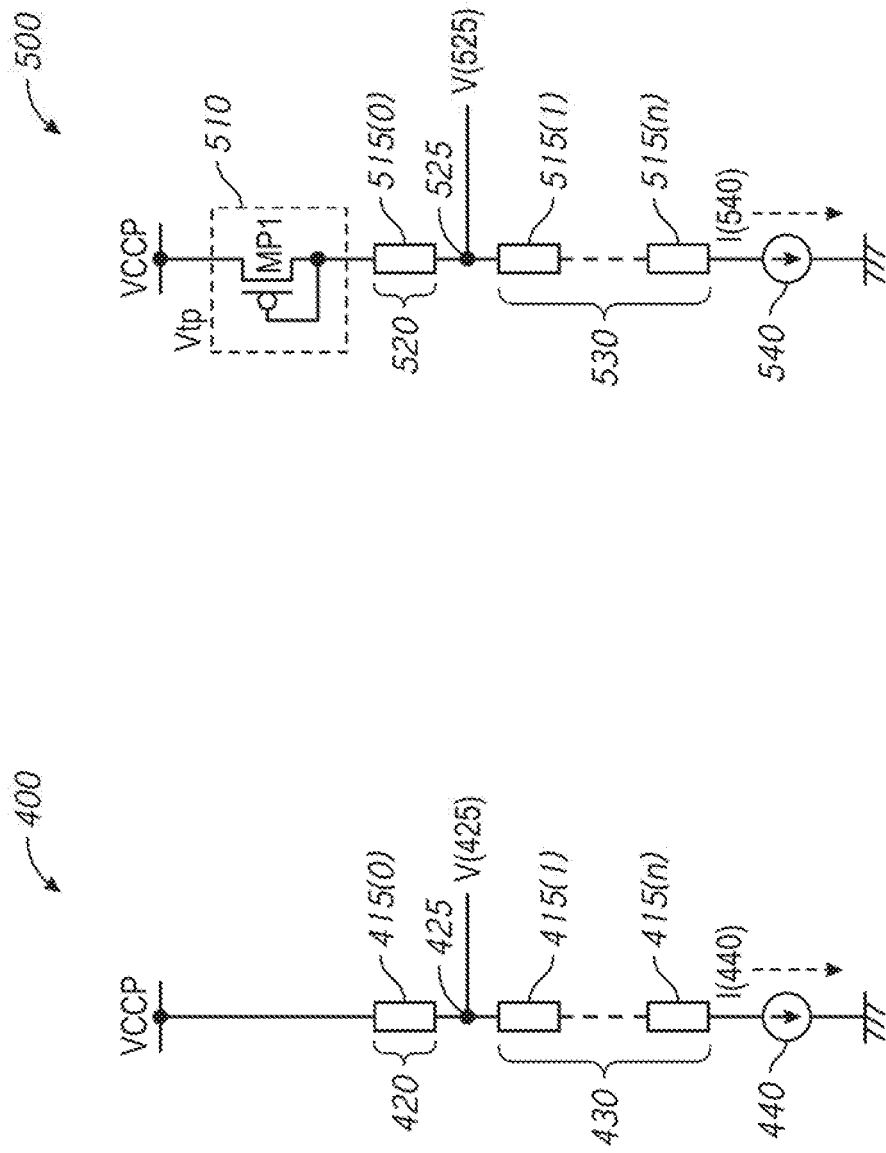
FIG. 4 is a schematic drawing of a bias circuit according to an embodiment of the disclosure.
FIG. 5 is a schematic drawing of a bias circuit according to an embodiment of the disclosure.

FIG. 4 is a schematic drawing of a bias circuit 400 according to an embodiment of the disclosure. The bias circuit 400 may be included in the bias circuit 130 in some embodiments of the disclosure.

The bias circuit 400 includes a plurality of resistances 415(0)-415(n), where n is a non-zero, whole number. The resistances 415(0)415(n) are referenced in FIG. 4 as two groups of resistances, in particular, resistance 420 and resistance 430. The resistance 420 includes resistance 415(0) and is coupled between a power supply (e.g., power supply providing VCCP supply voltage) and a node 425. A voltage V (425) is provided at the node 425. The resistance 430 includes resistances 415(1)-415(n) and is coupled between the node 425 and a current sink circuit 440. The current sink circuit 440 is coupled to a reference voltage to (e.g., ground). The current sink circuit 440 drains a current I (440) through the bias circuit 400. The resistance 430 and the current sink circuit 440 may be used to adjust a voltage V (420) of the resistance 420 by adjusting the current I (440).

In some embodiments of the disclosure, the resistances 415(0)-415(n) have the same magnitude of resistance. In other embodiments, one or more of the resistances 415(0)-415(n) has a different magnitude of resistance. The location of the node 425 between resistances 420 and 430 may be selectable in some embodiments of the disclosure. In such embodiments, the V (425) voltage may be adjusted according to the selected location of the node 425. The V (425) voltage may be provided to an input circuit of a voltage circuit, for example, to the input circuit 118 of the voltage circuit 100 of FIG. 1.

In operation, the V (425) voltage provided at the node 425 is based on the ratio of resistance 430 to the total resistance of resistances 420 and 430. For example, the voltage V (425) at the node 425 for the bias circuit 400 is:

$$V(425)=[VCCP \times (R(430)/(R(420)+R(430)))].$$

For the sake of simplifying the equation for the V (425) voltage, it is assumed that the V (425) voltage is referenced as the Vin voltage. As a result:

$$V(425)=Vin.$$

In embodiments of the disclosure where the bias circuit 400 is included in the bias circuit 130, and the V (425) voltage is provided to the input circuit 118 of the voltage circuit 100, the Vout of the voltage circuit 100 is equal to the sum of the Yin voltage and the threshold voltage Vtp (118) of a p-channel transistor included in the input circuit 118. That is:

$$Vout=Vin-Vtp(118).$$

In an example, the supply voltage VCCP is 3.1 V, the current I (440) is 0.25 uA, the threshold voltage Vtp (118) is 300 mV, and voltage V (425) provided by the bias circuit 400 is 255 V. The particular values have been provided by way of example, and it will be appreciated that embodiments of the disclosure are not limited to the particular values described.

FIG. 5 is a schematic drawing of a bias circuit 500 according to an embodiment of the disclosure The bias circuit 500 may be included in the bias circuit 130 in some embodiments of the disclosure.

The bias circuit 500 includes a load circuit 510 configured to be coupled to a power supply (e.g., power supply providing VCCP supply voltage), and a plurality of resistances 515(0)-515(n), where n is a non-zero, whole number. The resistances 515(0)-515(n) are referenced in FIG. 5 as two groups of resistances, in particular, resistance 520 and resistance 530. The resistance 520 includes resistance 515(0) and is coupled between the load circuit 510 and a node 525. A voltage V (525) is provided at the node 525. The resistance 530 includes resistances 515(1)-515(n) and is coupled between the node 525 and a current sink circuit 540. The current sink circuit 540 is coupled to a reference voltage (e.g., ground), The current sink circuit 540 drains a current I (540) through the bias circuit 500, The resistance 530 and the current sink circuit 540 may be used to adjust a voltage V (520) of the resistance 520 by adjusting the current I (540).

In some embodiments of the disclosure, the resistances 515(0)-515(n) have the same magnitude of resistance. In other embodiments, one or more of the resistances 515(0)-515(n) has a different magnitude of resistance. The location of the node 525 between resistances 520 and 530 may be selectable in some embodiments of the disclosure. In such embodiments, the V (525) voltage may be adjusted according to the selected location of the node 525. The V (525) voltage may be provided to an input circuit of a voltage circuit, for example, to the input circuit 118 of the voltage circuit 100 of FIG. 1.

The load circuit 510 is shown in the embodiment of FIG. 5 as a load coupled p-channel transistor (e.g., a gate and a drain are coupled together). The load coupled p-channel transistor reduces the voltage of the power supply by the threshold voltage Vtp (510) of the p-channel transistor. In some embodiments of the disclosure, the p-channel transistor of the load circuit 510 is matched to an input circuit of a voltage circuit, for example, the input circuit 118 of the voltage circuit 100 of FIG. 1. That is, the p-channel transistor of the load circuit 510 has the same transistor dimensions and transistor characteristics (e.g., same channel length, channel width, threshold voltage, etc.) as a p-channel transistor included in the input circuit 118.

In operation, the V (525) voltage provided at the node 525 is the supply voltage VCCP less the threshold voltage Vtp (510) and less the voltage V (520) of the resistance 520. For example, the voltage V (525) at the node 525 for the bias circuit 500 is:

$$V(525)=VCCP-Vtp(510)-V(520).$$

In embodiments of the disclosure where the bias circuit 500 is included in the bias circuit 130, the load circuit 510 is matched to the input circuit 118, and the V (525) voltage is provided to the input circuit 118 of the voltage circuit 100, the Vout is provided as follows:

$$Vtp(510)=Vtp(118),$$

$$V(525)=Vin,$$

$$Vout=Vin+Vtp(118),$$

thus, $Vout=VCCP-V(520).$

In an example, the supply voltage VCCP is 3.1 V, the current I (540) is 0.25 uA, the threshold voltage Vtp (510) (and matched to Vtp (118)) is 300 mV, and voltage V (525)

provided by the bias circuit 500 is 2.25 V. The particular values have been provided by way of example, and it will be appreciated that embodiments of the disclosure are not limited to the particular values described.

Figure 6:
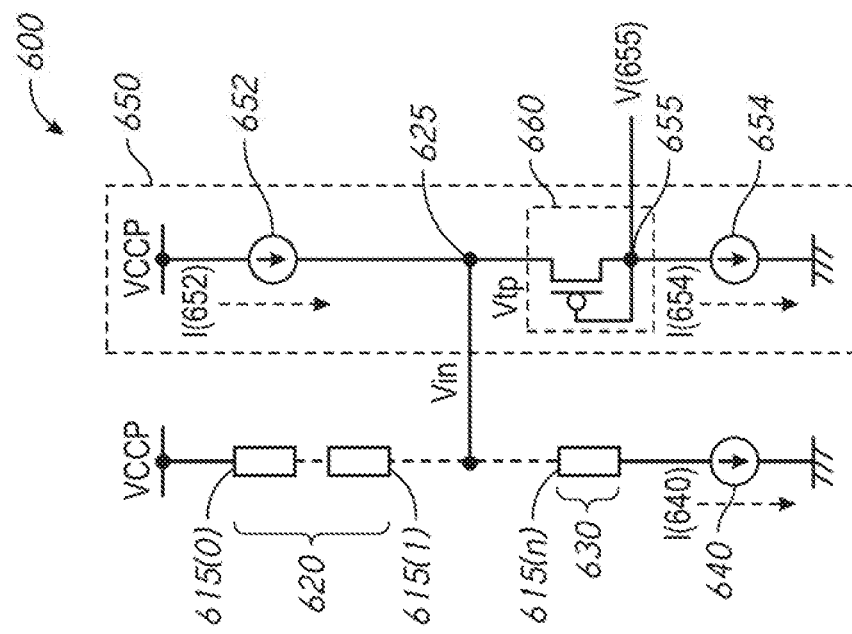
FIG. 6 is a schematic drawing of a bias circuit according to an embodiment of the disclosure.

FIG. 6 is a schematic drawing of a bias circuit 600 according to an embodiment of the disclosure. The bias circuit 600 may be included in the bias circuit 130 in some embodiments of the disclosure.

The bias circuit 600 includes a plurality of resistances 615(0)-615(n), where n is a non-zero, whole number. The resistances 615(0)-615(n) are referenced in FIG. 6 as two groups of resistances, in particular, resistance 620 and resistance 630. The resistance 620 includes resistances 615(0) and 615(1), and is coupled between a power supply (e.g., power supply providing VCCP supply voltage) and a node 625. A voltage V (625) is provided at the node 625. The resistance 630 includes resistance 615(n) and is coupled between the node 625 and a current sink circuit 640, The current sink circuit 640 is coupled to a reference voltage (e.g., ground). The current sink circuit 640 drains a current I (640) through the bias circuit 600 The resistance 630 and the current sink circuit 640 may be used to adjust a voltage V (620) of the resistance 620 by adjusting the current I (640).

In some embodiments of the disclosure, the resistances 615(0)-615(n) have the same magnitude of resistance. In other embodiments, one or more of the resistances 615(0)-615(n) has a different magnitude of resistance. The location of the node 625 between resistances 620 and 630 may be selectable in some embodiments of the disclosure. In such embodiments, the V (625) voltage may be adjusted according to the selected location of the node 625.

The bias circuit 600 further includes a level shifter circuit 650. The level shifter circuit 650 includes a current source circuit 652 coupled between a power supply (e.g., power supply providing VCCP supply voltage) and the node 625. The level shifter circuit 650 further includes a load circuit 660 and a current sink circuit 654 coupled in series between the node 625 and a reference voltage (e.g., ground). The current sink circuit 654 drains a current I (654) through the level shifter circuit 650. A voltage V (655) is provided at the node 655 that is between the load circuit 660 and the current sink circuit 654. The V (655) voltage may be provided to an input circuit of a voltage circuit, for example, to the input circuit 118 of the voltage circuit 100 of FIG. 1.

The load circuit 660 is shown in the embodiment of FIG. 6 as a load coupled p-channel transistor. The load coupled p-channel transistor reduces the V (625) voltage by the threshold voltage Vtp (660) of the p-channel transistor. In some embodiments of the disclosure, the p-channel transistor of the load circuit 660 is matched to an input circuit of a voltage circuit, for example, the input circuit 118 of the voltage circuit 100 of FIG. 1. That is, the p-channel transistor of the load circuit 660 has the same transistor dimensions and transistor characteristics (e.g, same channel length, channel width, threshold voltage, etc.) as a p-channel transistor included in the input circuit 118.

In operation, the V (625) voltage provided at the node 625 is the supply voltage VCCP less the voltage V (620) of the resistance 620. For example, the voltage V (625) at the node 625 for the bias circuit 600 is:

$$V(625)=VCCP-V(620).$$

For the sake of simplifying the equation for the V (625) voltage, it is assumed that the V (625) voltage is referenced as the Vin voltage, As a result:

$$V(625)=Vin.$$

The V (625) voltage (i.e., the Vin voltage) is reduced by Vtp (660) of the load circuit 660. Thus, the V (655) voltage at the node 655 is:

$$V(655)=Vin-Vtp(660).$$

In embodiments of the disclosure where the bias circuit 600 is included in the bias circuit 130, the load circuit. 660 is matched to the input circuit 118, and the V (655) voltage is provided to the input circuit 118 of the voltage circuit 100, the Vout of the voltage circuit 100 is as follows:

$$Vtp(660)=Vtp(118),$$

$$Vout=V(655)+Vtp(118),$$

$$Vout=(Vin-Vtp(660))+Vtp\ (118)=Vin.$$

The bias circuit 600 includes the level shifter circuit 650 to reduce the Via voltage provided at the node 625 by the threshold voltage Vtp (660) of the load circuit 660. As previously described, the p-channel transistor of the load circuit 660 may be matched to the p-channel transistor of the input circuit 118. In the bias circuit 600, the level of the Vin voltage at the node 625 may be detected directly without the voltage reduction provided by the load circuit 660. As a result, the output voltage may be set irrespective of fluctuations in the Vin voltage. Additionally, a voltage provided between the VCCP voltage and ground of the circuit provided the Vin voltage may be higher, and consequently, a higher accuracy circuit may be used for the current sink circuit 640, for example, using a cascade connection for the current sink circuit 640.

In an example, the supply voltage VCCP is 3.1 V, the current I (640), I (652), and I (654) are each 0.25 uA, the threshold voltage Vtp (660) (and matched to Vtp (118)) is 300 mV, voltage V (625) is 2.55 V, and voltage V (655) is 2.25 V. The particular values have been provided by way of example, and it will be appreciated that embodiments of the disclosure are not limited to the particular values described.

Figure 7:
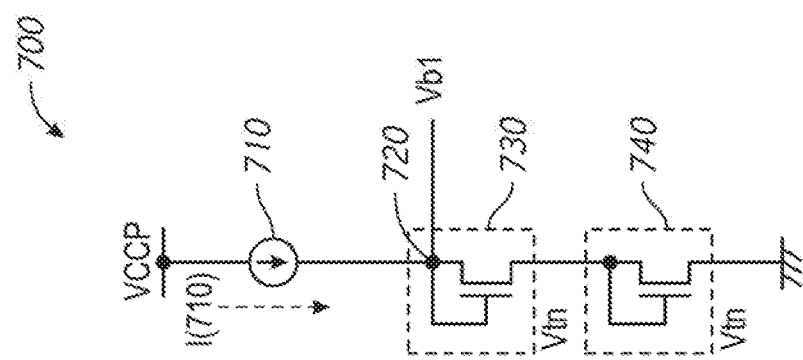
FIG. 7 is a schematic diagram of a bias circuit according to an embodiment of the disclosure.

FIG. 7 is a schematic diagram of a bias circuit 700 according to an embodiment of the disclosure. The bias circuit 700 may be included in the bias circuit 140 in some embodiments of the disclosure.

The bias circuit 700 includes a current source circuit 710 coupled between a power supply (e.g., power supply providing VCCP supply voltage) and a node 720. The current source circuit 710 provides a current I (710). A bias voltage Vb1 is provided at the node 720. The bias circuit 700 further includes a load circuit 730 and a load circuit 740 coupled in series between a reference voltage (e.g., ground) and the node 720. in the embodiment of FIG. 7, the load circuit 730 is shown as a load coupled n-channel transistor and the load circuit 740 is shown as a load coupled n-channel transistor. The load coupled n-channel transistors add the sum of the threshold voltages Vtn (730) and Vtn (740) of the n-channel transistors 730 and 740 to the reference voltage. In embodiments of the disclosure where the reference voltage is ground, the Vb1 voltage provided at the node 720 is:

$$Vb1=Vtn(730)+Vtn(740).$$

In some embodiments of the disclosure, the n-channel transistor of the load circuit 730 is matched to the transistor of a current circuit of a voltage circuit, and the n-channel transistor of the load circuit 740 is matched to the transistor of a pull-down circuit of the voltage circuit. For example, in embodiments of the disclosure where the bias circuit 700 is included in the bias circuit 140 of the voltage circuit 100, the n-channel transistor of the load circuit 730 is matched to the transistor 126 of the current circuit 120 and the n-channel transistor of the load circuit 740 is matched to the pull-down circuit 114 of the output circuit 110. That is, the n-channel transistor of the load circuit 730 and the n-channel transistor of the load circuit 740 have the same transistor dimensions and transistor characteristics (e.g., same channel length, channel width, threshold voltage, etc.) as the transistor 126 and the n-channel transistor of the pull-down circuit 114, respectively. In some embodiments, the pull-down circuit 114 may include an n-channel transistor that has a channel length that is scaled by a factor "m" relative to the channel length of the load circuit 740. As a result, the current through the pull-down circuit 114 will be similarly scaled by the factor of "m" relative to the current through the load circuit 740.

In operation, the bias circuit 700 provides a bias voltage Vb1 at the node 720 that is the sum of the threshold voltages of the load circuits 730 and 740 corresponding to a current I (710) of the current source circuit 710. In an embodiment where the load circuits 730 and 740 include n-channel transistors that are matched to the transistor 126 and the channel transistor of the pull-down circuit 114, respectively, the Vb1 voltage is sufficient to cause the transistor 126 to be conductive relative to a Vgn voltage of the pull-down circuit 114 being at the threshold voltage Vtn (114) of the pull-down circuit 114. The current I (710) provided by the current source circuit 710, and the load circuits 730 and 740 may set a current through the transistor 126.

In an example, the supply voltage VCCP is 3.1 V, the current I (710) is 0.25 uA, the threshold voltages Vtn (730) and Vtn (740) (and matched to Vtn (126) and Vtn (114)) are 300 mV, voltage Vb1 is 2.25 V. The particular values have been provided by way of example, and it will be appreciated that embodiments of the disclosure are not limited to the particular values described.

Figure 8:
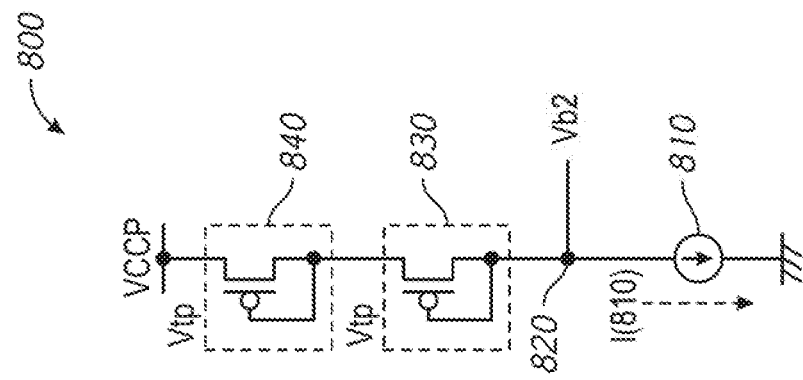
FIG. 8 is a schematic diagram of a bias circuit according to an embodiment of the disclosure.

FIG. 8 is a schematic diagram of a bias circuit 800 according to an embodiment of the disclosure. The bias circuit 800 may be included in the bias circuit 150 in some embodiments of the disclosure.

The bias circuit 800 includes a current sink circuit 810 coupled between a reference voltage (e.g., ground) and a node 820. The current sink circuit 810 drains a current I (810). A bias voltage Vb2 is provided at the node 820. The bias circuit 800 further includes a load circuit 830 and a load circuit 840 coupled in series between a power supply (e.g., power supply providing VCCP supply voltage) and the node 820. In the embodiment of FIG. 8, the load circuit 830 is shown as a load coupled p-channel transistor and the load circuit 840 is shown as a load coupled p-channel transistor. The load coupled p-channel transistors reduce the voltage VCCP of the power supply by the respective threshold voltages Vtp (830) and Vtp (840) of the p-channel transistor. Thus, the Vb2 voltage provided at the node 820 is:

$$Vb2 = VCCP - (Vtp(830) + Vtp(840)).$$

In some embodiments of the disclosure, the p-channel transistor of the load circuit 830 is matched to the transistor of a current circuit of a voltage circuit, and the p-channel transistor of the load circuit 840 is matched to the transistor of a pull-up circuit of the voltage circuit. For example, in embodiments of the disclosure where the bias circuit 800 is included in the bias circuit 150 of the voltage circuit 100, the p-channel transistor of the load circuit 830 is matched to the transistor 128 of the current circuit 120 and the p-channel transistor of the load circuit 840 is matched to the pull-up circuit 112 of the output circuit 110. That is, the p-channel transistor of the load circuit 830 and the p-channel transistor of the load circuit 840 have the same transistor dimensions and transistor characteristics (e.g., same channel length, channel width, threshold voltage, etc.) as the transistor 128 and the p-channel transistor of the pull-up circuit 112, respectively. In some embodiments, the pull-up circuit 112 may include a p-channel transistor that has a channel length that is scaled by a factor "m" relative to the channel length of the load circuit 840. As a result, the current through the pull-up circuit 112 will be similarly scaled by the factor of "m" relative to the current through the load circuit 840.

In operation, the bias circuit 800 provides a bias voltage Vb2 at the node 820 that is the VCCP voltage decreased by the sum of the threshold voltages of the load circuits 830 and 840 corresponding to the current I (810) of the current sink circuit 810. In an embodiment where the load circuits 830 and 840 include p-channel transistors that are matched to the transistor 128 and the p-channel transistor of the pull-up circuit 112, respectively, the Vb2 voltage is sufficient to cause the transistor 128 to be conductive relative to a Vgp voltage of the pull-up circuit 112 being at the threshold voltage Vtp (112) of the pull-up circuit 112. The current I (810) provided by the current sink circuit 810, and the load circuits 830 and 840 may set a current through the transistor 128.

In an example, the supply voltage VCCP is 3.1 V, the current I (810) is 0.25 uA, the threshold voltages Vtp (830) and Vtp (840) (and matched to Vtp (128) and Vtp (112)) are 300 mV, voltage VB1 is 2.7 V. The particular values have been provided by way of example, and it will be appreciated that embodiments of the disclosure are not limited to the particular values described.

Figure 9:
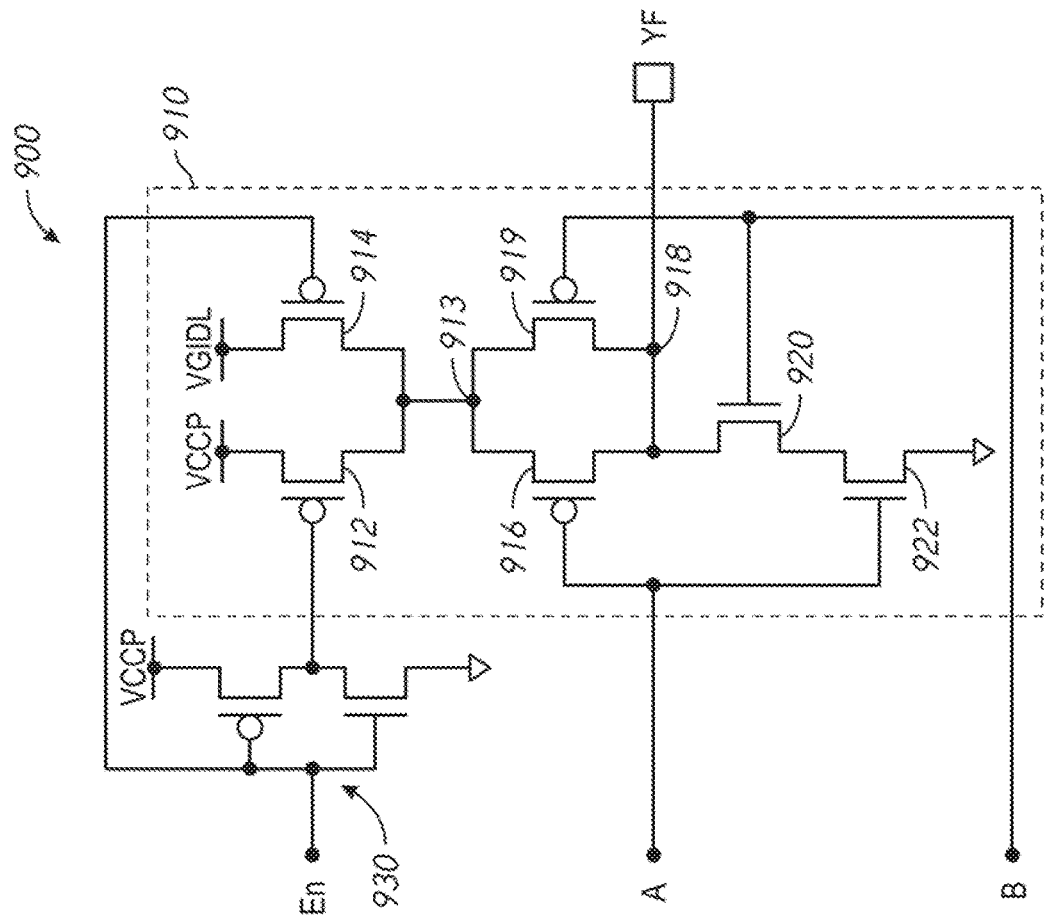
FIG. 9 is a schematic illustration of a row decoder circuit in accordance with the present disclosure.

FIG. 9 is a schematic diagram of a wordline driver 900. The wordline driver 900 includes a driver circuit 910. The driver circuit 910 is enabled by an enable signal EN and the complement of the EN signal. The complement of the EN signal is provided by an inverter circuit 930. The driver circuit 910 is provided pre-decoded address signals A and B. When enabled by the EN signal and the A and B signals are high (indicating a match with a corresponding wordline), the driver circuit 910 provides an active (i.e., low) YF signal to activate the corresponding wordline.

The driver circuit 910 includes a transistor 912 configured to be coupled to a first power supply (e.g., power supply providing VCCP supply voltage) and a supply node 913. The driver circuit 910 further includes a transistor 914 coupled to a second power supply and the supply node 913 (e.g., power supply providing a VGIDL voltage). The transistor 912 is activated (e.g., conductive) and the transistor 914 is deactivated (e.g., not conductive) by an active EN signal (e.g., active high logic level). Conversely, the transistor 914 is deactivated and the transistor 914 is activated by an inactive EN signal (e.g., inactive low logic level). Activation of the transistor 912 results in the VCCP voltage provided to the supply node 913, whereas activation of the transistors 914 results in the VGIDL voltage provided to the supply node 913. As will be described in more detail below, the VGIDL voltage may be a voltage that may be used by the driver circuit 910 when not enabled (e.g., when the EN signal is inactive) to reduce leakage currents in the driver circuit 910. In some embodiments of the disclosure, the VGIDL voltage may be provided by a voltage circuit according to an embodiment of the disclosure.

The driver circuit 910 further includes transistors 916 and 919 coupled to the supply node 913 and an output node 918. The YF signal is provided at the output node 918. Transistors 920 and 922 are coupled in series between the output node 918 and a reference voltage (e.g., ground). The A signal is provided to the transistors 916 and 922, and the B signal is provided to the transistors 919 and 920.

In operation, when the driver circuit 910 is enabled by an active EN signal, the VCCP voltage is provided to the output node 918, except when the A and B signals are both at a high logic level. That is, the YF signal is provided having the VCCP voltage unless the A and B signals are both at the high logic level. High logic level A and B signals indicates that the address represented by the A and B signals corresponds to the wordline that is driven by the YF signal provided by the wordline driver 900. When the A and B signals are both at the high logic level, the transistors 920 and 922 are activated and the YF signal is provided having a ground voltage level. When the driver circuit 910 is disabled by an inactive EN signal (e.g., during a standby state), the VGIDL voltage is provided to the supply node 913. While the EN signal is inactive, at least one of the A and B signals is at a low logic level, resulting in the VGIDL voltage being provided to the output node 918. Thus, when the driver circuit 910 is disabled, the VGIDL voltage is provided to the output node 918.

Providing the VGIDL voltage to the output node 918 while the driver circuit 910 is disabled, may reduce leakage current through, for example, the transistor 920. As known, gate induced drain leakage (GIDL) currents may result when a voltage difference between a gate and a drain is significant. The VGIDL voltage may be less than the VCCP voltage. Thus, a voltage difference between the gate and drain of the transistor 920 is reduced by provided the VGIDL voltage to the output node 918 in comparison to providing the VCCP voltage to the output node 918. As a result, providing the VGIDL voltage to the output node 918 while the driver circuit 910 is disabled may cause lower GIDL currents compared to providing the VCCP voltage.

Figure 10:
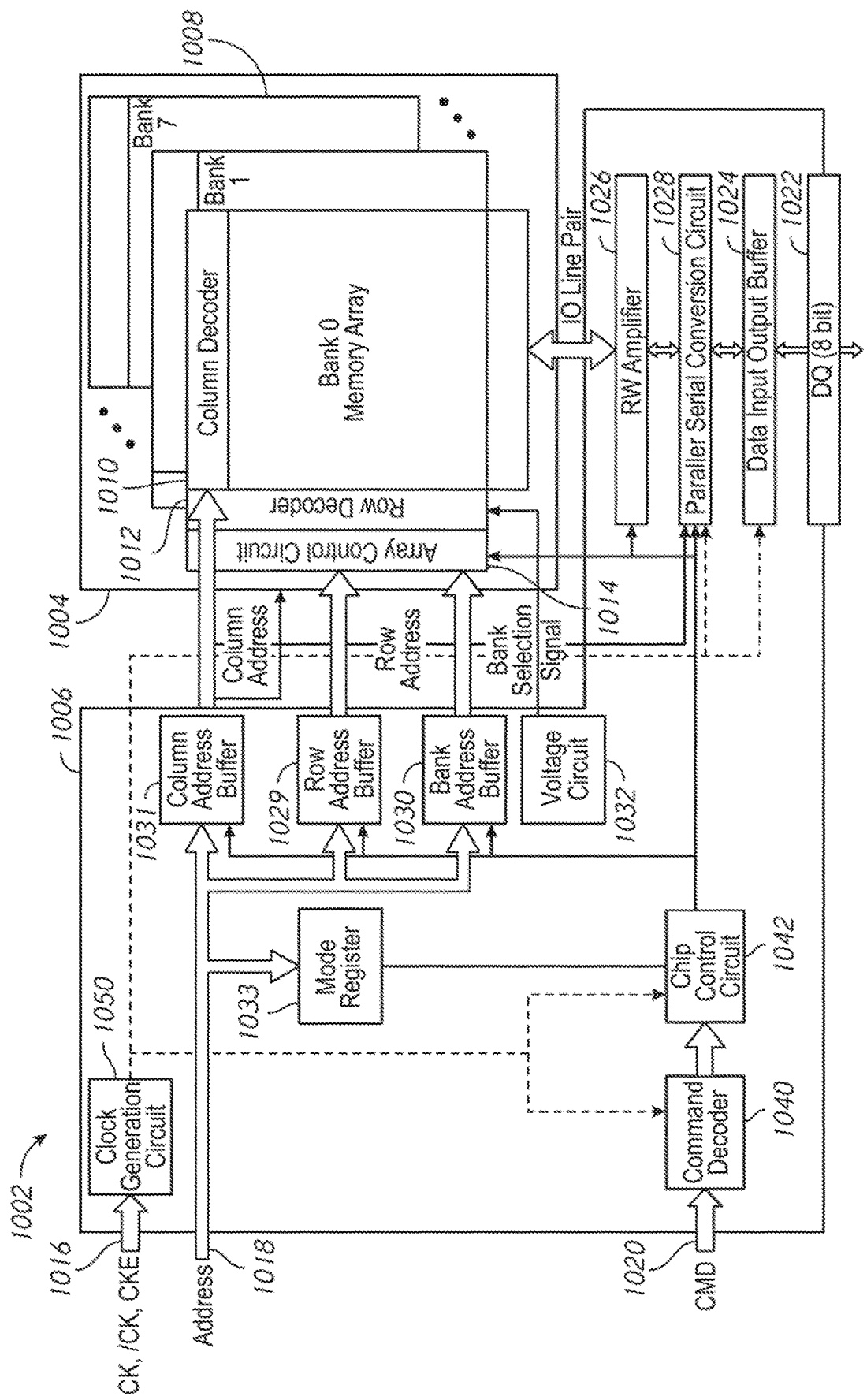
FIG. 10 is a block diagram of a memory that includes a voltage circuit according to an embodiment of the present disclosure.

FIG. 10 is a block diagram of a memory 1002 that may utilize a voltage circuit according to an embodiment of the disclosure. The memory 1002 may be volatile memory or non-volatile memory integrated into a single semiconductor chip, for example. However, other devices may also be the memory 1002 of the present disclosure. The memory 1002 may be mounted on a memory module substrate, a mother board or the like (not shown). The memory chip includes a memory cell array region 1004 and a peripheral circuit region 1006. The memory cell array region 1004 includes a memory cell array 1008 including a plurality of banks, each bank including a plurality of word lines, a plurality of bit lines, and a plurality of memory cells arranged at intersections of the plurality of word lines and the plurality of bit lines. For example, a number of the plurality of banks may be eight as shown in FIG. 10. The selection of the bit line is performed by a plurality of column decoders 1010 and the selection of the word line is performed by a plurality of row decoders 1012. An array control circuit 1014 is provided for selecting a bank of the memory cell array 1008.

The peripheral circuit region 1006 includes clock terminals 1016, address terminals 1018, command terminals 1020, and data input/output (I/O) terminals (DQ) 1022. For example, the data I/O terminals may handle eight-bit data communication. Data input Output (I/O) buffers 1024 are coupled to the data input/output terminals (DQ) 1022 for data accesses, such as read accesses and write accesses of memories. The data accesses between the data I/O butler 1024 and the memory cell array 1008 may be executed by a read/write (RW) amplifier 1026 and a parallel serial conversion circuit 1028 that converts between parallel data in the memory cell array region 1004 and the data. I/O terminal 1022. Thus, the data is transferred between the RW amplifier 1026 and the data I/O buffer 1024.

The address terminals 1018 are supplied with address signals. The address signals may include row address signals, column address signals, and bank address signals. The bank address signals may be used for selecting a bank among the plurality of banks. The bank address signals are provided to an array control circuit 1014 for selecting a bank via a bank address buffer 1030 as a bank selection signal. For example, there are three bank address signals BA0-BA2 which allows to select one bank among eight banks as shown in FIG. 10. In one embodiment of the disclosure, a row address and a column address may be provided on the address signals by address multiplexing.

The command terminals 1020 may be provided command signals that represent memory commands (e.g., read commands, write commands, etc.) to be performed by the memory 1002. For example, the command terminals 1020 may include a chip select (/CS) pin for receiving a complementary CS signal, a row address strobe (/RAS) pin for receiving a RAS signal, a column address strobe (/CAS) pin for receiving a CAS signal, a wrote enable (/WE) pin for receiving a WE signal and the like. A command decoder 1040 decodes the command signals from the command terminals 1020 to receive various commands including a read command and a write command, and provides control signals responsive to the received commands to a chip control circuit 1042.

Accordingly, read data is read from a memory cell in the memory cell array 1008 designated by a row address and a column address, when the read command is issued and the row address and the column address are timely supplied with the read command. The read data DQ is output from the data I/O terminals 1022 via the RW amplifier 1026, the parallel serial conversion circuit 1028 and the data 110 buffer 1024. Similarly, write data DQ is supplied to the data I/O terminals 1022 via the data I/O buffer 1024, the parallel serial conversion circuit 1028, and the RW amplifier 1026 to the memory cell array 1008 and is written to the memory cell designated by a row address and a column address when the write command is issued and the row address and the column address are timely supplied with the write command.

The clock terminals 1016 may be provided with clock signals and control signals that are used to time operations of the memory 1002. For example, the clock terminals 1016 may be provided clock signals CK and /CK, and a clock enable (CKE) signal. The CKE signal may activate or deactivate internal clock circuits, input buffers and output drivers, thus the CKE signal is part of a command. The external clock signals CK and /CK are complementary to each other and are supplied to a clock generator 1050. The clock generator 1050 receives the external clock signals CK and /CK and may execute phase control and generates an internal clock signal based on the received external clock signals and the CKE signal. Although not limited thereto, a DLL circuit can be used as the clock generator 1016. The internal clock signal may be supplied various circuits, including the command decoder 1040, the chip control circuit 1042, the data I/O buffer 1024, or the like. The various circuits may use the internal clock signal as a timing signal.

A voltage circuit according to an embodiment of the disclosure may be used in connection with various components illustrated in FIG. 10, In one example, a voltage circuit 1032 may be used in connection with the row decoder 1012. The voltage circuit 1032 provides an output voltage Vout to one or more wordline drivers included in the row decoder 1012. The Vout voltage may be provided to the wordline drivers as a VGIDL voltage. In an embodiment of the disclosure, the wordline driver 900 of FIG. 9 may be included in the row decoder 1012. As previously described, providing a voltage that has a lower voltage than a power supply voltage (e.g., VCCP) may reduce leakage currents (e.g., gate induced drain leakage (GIDL) currents) in the wordline drivers compared to providing the supply voltage while the wordline drivers are disabled (e.g., during a standby state).

From the foregoing it will be appreciated that, although specific embodiments of the disclosure have been described herein for purposes of illustration, various modifications may be made without deviating from the spirit and scope of the disclosure. Accordingly, the scope disclosure should not be limited any of the specific embodiments described herein.

What is claimed is:

1. An apparatus, comprising:
    a first bias circuit configured to provide a first bias signal;
    a second bias circuit configured to provide a second bias signal;
    a third bias circuit configured to provide a third bias signal, wherein the first bias circuit, the second bias circuit and the third bias circuit each includes a respective current source circuit, each current source circuit configured to provide a respective bias current, and wherein the bias currents of the first, second, and third bias circuits are equal; and
    a voltage output circuit configured to receive the first, second, and third bias signals, the voltage output circuit including:
        an output circuit including an output node and a first node, and further including an input circuit configured to receive the first bias signal, the output circuit configured to provide an output voltage at the output node having a magnitude based on the magnitude of the first bias signal; and
        a current circuit coupled to the output circuit and including a first transistor configured to receive the second bias signal and further including a second transistor configured to receive the third bias signal, wherein the first transistor and second transistor are coupled in parallel and to the first node.

2. The apparatus of claim 1, wherein the first bias circuit comprises:
    a plurality of resistances coupled in series; and
    a current source circuit coupled in series with the plurality of resistances and further coupled to a reference voltage.

3. The apparatus of claim 1, wherein the second bias circuit comprises a current source circuit configured to provide a current that is equal to a current through the first transistor.

4. The apparatus of claim 1, wherein the third bias circuit comprises a current source circuit configured to provide a current that is equal to a current through the second transistor.

5. The apparatus of claim 1, wherein the second bias circuit includes first and second load circuits.

6. The apparatus of claim 5, wherein the second load circuit is configured to have a second threshold voltage matched to a threshold voltage of the first transistor.

7. The apparatus of claim 5, wherein the second bias circuit further includes a current source circuit coupled in series with the first load circuit and the second load circuit.

8. The apparatus of claim 1, wherein the second bias circuit includes first and second load coupled transistors.

9. The apparatus of claim 1, wherein each of the second and third bias circuits includes a plurality of load circuits, and
    wherein each of the plurality of load circuits is a transistor.

10. The apparatus of claim 1, wherein the third bias circuit includes a first load circuit and a second load circuit, and the second load circuit is configured to have a threshold voltage matched to a threshold voltage of the second transistor.

11. An apparatus, comprising:
    a plurality of bias circuits configured to provide a plurality of bias signals, respectively, wherein each of the plurality of bias circuits includes a respective current source circuit, each current source circuit configured to provide a respective bias current, and wherein the bias currents for the plurality of bias circuits are equal; and
    a plurality of transistors configured to receive the plurality of bias signals,
    wherein each of the plurality of transistors is coupled to a first node, wherein a first one of the plurality of transistors is coupled to the first node at a drain of the first one of the plurality of transistors, a second one of the plurality of transistors is coupled to the first node at a drain of the second one of the plurality of transistors, and a third one of the plurality of transistors is coupled to the first node at a source of the third one of the plurality of transistors, wherein the second and third transistors are coupled in parallel and to the first node and
    wherein an output circuit including the first one of the plurality of transistors is coupled to an output node at a source of the first one of the plurality of transistors, the output circuit configured to provide an output voltage at the output node having a magnitude based on a magnitude of a first bias signal of the plurality of bias signals,
    wherein the second one of the plurality of transistors receives a second bias signal of the plurality of bias signals, wherein a magnitude of the second bias signal is sufficient to cause the second one of the plurality of transistors to be conductive relative to a gate voltage of a pull-down circuit, wherein a gate of the pull-down circuit is coupled to the drain of the second one of the plurality of transistors, and
    wherein the third one of the plurality of transistors receives a third bias signal of the plurality of bias signals at a gate of the third one of the plurality of transistors, wherein a magnitude of the third bias signal is sufficient to cause the third one of the plurality of transistors to be conductive relative to a gate voltage of a pull-up circuit, wherein a gate of the pull-up circuit is coupled to a drain of the third one of the plurality of transistors.

12. The apparatus of claim 11, wherein the plurality of bias circuits includes first through third bias circuits, and the second bias circuit includes a current source circuit configured to provide a current that is equal to a current through the first transistor.

13. The apparatus of claim 11, wherein the plurality of bias circuits includes first through third bias circuits, and
    wherein each of the second and third bias circuits includes a plurality of load circuits.

14. An apparatus, comprising:
    first through third bias circuits configured to provide first through third bias signals, respectively, wherein the first through third bias circuits each includes a respective current source circuit, each current source circuit configured to provide a respective bias current, and wherein the bias currents of the first through third bias circuits are equal;

a current circuit configured to receive the second and third bias signals, wherein the current circuit includes:

a first transistor configured to receive the second bias signal, wherein a magnitude of the second bias signal is sufficient to cause the first transistor to be conductive relative to a gate voltage of a pull-down circuit, wherein a gate of the pull-down circuit is coupled to a drain of the first transistor;

a second transistor configured to receive the third bias signal, wherein a magnitude of the third bias signal is sufficient to cause the second transistor to be conductive relative to a gate voltage of a pull-up circuit, wherein a gate of the pull-up circuit is coupled to a drain of the second transistor, and wherein the first and second transistors are coupled in parallel and to a first node, wherein a gate of the pull-down circuit is coupled to the first node; and an output circuit configured to receive the first bias signal, and provide an output voltage having a magnitude based on a magnitude of the first bias signal, wherein the output circuit includes the pull-down circuit and the pull-up circuit, wherein the pull-down circuit and the pull-up circuit are coupled in series and the output voltage is provided from an output node coupled between the pull-down circuit and the pull-up circuit, wherein the output circuit further includes a third transistor coupled to the first node and the output node.

15. The apparatus of claim 14, wherein the first bias circuit includes a plurality of resistances coupled in series with each other, and wherein each of the second and third bias circuits includes a plurality of transistors.

16. The apparatus of claim 14, wherein the second bias circuit includes a first pair of transistors and a current source circuit coupled in series with the first pair of transistors, and wherein the third bias circuit includes a second pair of transistors and a current sink circuit coupled in series with the second pair of transistors.

* * * * *